US011974407B2

(12) United States Patent
Cao

(10) Patent No.: US 11,974,407 B2
(45) Date of Patent: Apr. 30, 2024

(54) FOLDABLE DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Huan Cao, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/622,856

(22) PCT Filed: Dec. 22, 2021

(86) PCT No.: PCT/CN2021/140323
§ 371 (c)(1),
(2) Date: Dec. 26, 2021

(87) PCT Pub. No.: WO2023/108742
PCT Pub. Date: Jun. 22, 2023

(65) Prior Publication Data
US 2024/0040724 A1    Feb. 1, 2024

(30) Foreign Application Priority Data
Dec. 14, 2021    (CN) .......................... 202111526269.X

(51) Int. Cl.
*H05K 5/02*    (2006.01)
*F16C 11/04*    (2006.01)
(52) U.S. Cl.
CPC ............ *H05K 5/0226* (2013.01); *F16C 11/04* (2013.01)

(58) Field of Classification Search
CPC ...................................................... H05K 7/00
See application file for complete search history.

(56) References Cited

U.S. PATENT DOCUMENTS

2020/0355216 A1    11/2020    Bae
2020/0363843 A1*   11/2020    Cheng ..................... H04M 1/02
(Continued)

FOREIGN PATENT DOCUMENTS

CN    101105198 A    1/2008
CN    206596049 U    10/2017
(Continued)

OTHER PUBLICATIONS

International Search Report in International application No. PCT/CN2021/140323, dated Sep. 14, 2022.
(Continued)

*Primary Examiner* — Jerry Wu
(74) *Attorney, Agent, or Firm* — PV IP PC; Wei Te Chung; Zhigang Ma

(57) ABSTRACT

A foldable display device is provided. A first support is connected to a first rotating member, and a second support is connected to a second rotating member. The first rotating member is rotatably connected to a fixing assembly and connected to a first abutting member. A second rotating member is rotatably connected to the fixing assembly and connected to a second abutting member. When the foldable display device is in a preset state, the first abutting member and a first elastic assembly abut against each other, and a second abutting member and a second elastic assembly abut against each other.

19 Claims, 6 Drawing Sheets

(56) References Cited

U.S. PATENT DOCUMENTS

2021/0018962 A1     1/2021  de la Fuente
2021/0247815 A1*    8/2021  Shim .................... G06F 1/1681

FOREIGN PATENT DOCUMENTS

| | | |
|---|---|---|
| CN | 206918043 U | 1/2018 |
| CN | 208190691 U | 12/2018 |
| CN | 210799707 U | 6/2020 |
| CN | 214247981 U | 9/2021 |
| CN | 113542457 A | 10/2021 |
| JP | 10579982 U | 10/1993 |
| JP | 2010270872 A | 12/2010 |
| JP | 2013164144 A | 8/2013 |
| KR | 20190135160 A | 12/2019 |
| KR | 20210116132 A | 9/2021 |
| TW | M484026 U | 8/2014 |
| WO | 2021209008 A1 | 10/2021 |

OTHER PUBLICATIONS

Written Opinion of the International Search Authority in International application No. PCT/CN2021/140323, dated Sep. 14, 2022.
Chinese Office Action issued in corresponding Chinese Patent Application No. 202111526269.X dated Jul. 27, 2022, pp. 1-8.

* cited by examiner

FOLDABLE DISPLAY DEVICE

FIELD OF INVENTION

The present application relates to the field of display technologies, and more particularly to a foldable display device.

BACKGROUND OF INVENTION

Foldable display device can switch between a folded state and a flattened state, which can meet user's requirements for large-size display. However, after an external force applied to the foldable display device in the conventional technology is removed, it is difficult for the foldable display device to stably maintain its folded state and flattened state, which reduces a user experience of using the foldable display device.

Therefore, it is necessary to propose a technical solution to solve the technical problem that it is difficult for the foldable display device to stably maintain its folded state and flattened state.

Technical Problem

The purpose of the present application is to provide a foldable display device to solve the problem that it is difficult for the foldable display device to stably maintain its folded state and flattened state.

SUMMARY OF INVENTION

A foldable display device, wherein the foldable display device comprises a hinge assembly, a first support, a second support, and a display screen, the hinge assembly is connected between the first support and the second support, the display screen is located on the first support, the second support, and the hinge assembly, and the hinge assembly comprises:
  a fixing assembly;
  a rotating assembly, wherein the rotating assembly comprises:
  a first rotating member connected to the first support and rotatably connected to the fixing assembly;
  a second rotating member connected with the second support and rotatably connected to the fixing assembly; and
  a locking assembly, wherein the locking assembly comprises:
  a first abutting member connected to the first rotating member, wherein when the first rotating member rotates, the first abutting member rotates with the first rotating member;
  a second abutting member connected to the second rotating member, wherein when the second rotating member rotates, the second abutting member rotates with the second rotating member;
  a first elastic assembly disposed on the fixing assembly; and
  a second elastic assembly disposed on the fixing assembly;
  wherein when the foldable display device is in a preset state, the first elastic assembly and the first abutting member abut against each other, and the second elastic assembly and the second abutting member abut against each other.

BENEFICIAL EFFECT

The application provides a foldable display device. The first support is connected with the first rotating member, and the second support is connected with the second rotating member. The first rotating member is rotatably connected with the fixing assembly and connected with the first abutting member. The second rotating member is rotatably connected with the fixing assembly and connected with the second abutting member. When the foldable display device is in a preset state, the first abutting member and the first elastic assembly disposed on the fixing assembly abut against each other, and the second abutting member abuts against the second elastic assembly arranged on the fixing assembly. This enables the first support to be stably held by abutment when it rotates to a preset angle relative to the fixing assembly. In addition, when the second support rotates to a preset angle relative to the fixing assembly, it can be stably held by abutting. This is beneficial for the foldable display device to park stably in the preset state. In addition, because the first abutting member and the first elastic assembly abut against each other and the second abutting member and the second elastic assembly abut against each other, this makes the foldable display device free from folding noise during a process of flattening and folding.

DETAILED DESCRIPTION OF PREFERRED EMBODIMENTS

Figure 1:
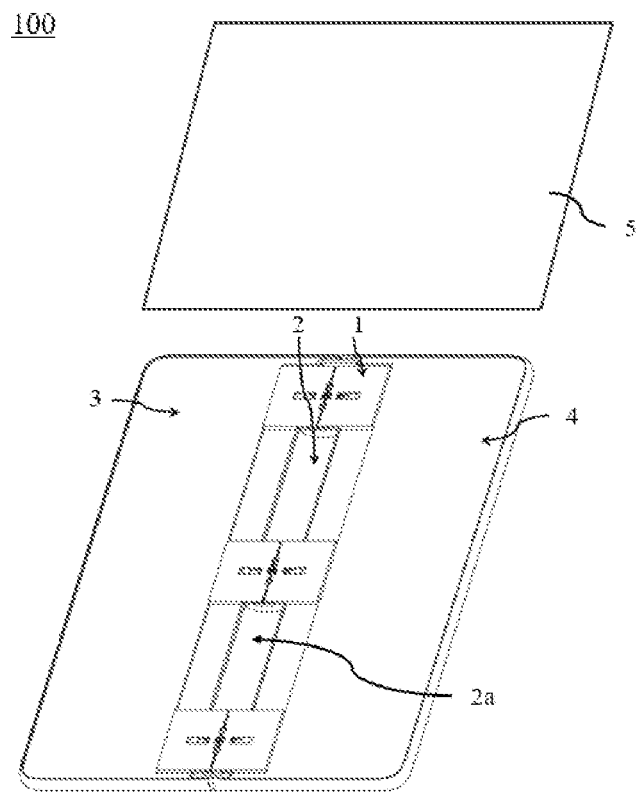
FIG. 1 is a first schematic diagram of a foldable display device according to an embodiment of this application.

The technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in this application, all other embodiments obtained by those skilled in the art without creative work shall fall within the protection scope of this application.

The present application provides a foldable display device 100, which is a foldable display device 100 that is folded inward. It can be understood that the foldable display device 100 may also be a foldable display device 100 that is folded outward. The foldable display device 100 can be applied to televisions, tablet computers, smart phones, and the like.

In this embodiment, the foldable display device 100 includes a hinge assembly 1, a first support 3, a second support 4, a cover 2, and a display screen 5. The hinge assembly 1 is connected between the first support 3 and the second support 4. The first support 3 and the second support 4 rotate relatively under the action of external force. The display screen 5 is located on the first support 3, the second support 4, and the hinge assembly 1.

In this embodiment, the first support 3 and the second support 4 are both shells and they are the same, and they both serve to support the display screen 5. When an angle between the first support 3 and the second support 4 is 180 degrees, the foldable display device 100 is in a flattened state. When an angle between the first support 3 and the second support 4 is 0 degrees, the foldable display device 100 is in a second folded state. When an angle between the first support 3 and the second support 4 is greater than 0 degrees and less than 180 degrees, for example, the angle is 30 degrees, 50 degrees, 80 degrees, 90 degrees, 120 degrees, 150 degrees, or 160 degrees, the foldable display device 100 is in a first folded state, and the first folded state is a transition state between the flattened state and the second folded state.

It can be understood that when the foldable display device 100 is in the second folded state, the angle between the first support 3 and the second support 4 may also be greater than 0 degrees and less than 180 degrees.

In this embodiment, the display screen 5 is used for display. The display screen 5 includes a flexible organic light emitting diode display panel, and the display screen 5 further includes a polarizer and a protective cover plate arranged on the light emitting side of the flexible organic light emitting diode display panel. The display screen 5 also includes a backplane and the like arranged on the back of the light emitting side of the flexible organic light emitting diode display panel.

In this embodiment, the cover 2 functions to protect the hinge assembly 1. The cover 2 has a flat bottom plate, a first arc-shaped side plate, a second arc-shaped side plate, a first flat side plate and a second flat side plate. In the direction in which the first support 3 points to the second support 4, the first arc-shaped side plate and the second arc-shaped side plate are respectively connected to opposite sides of the flat bottom plate. In the direction perpendicular to the first support 3 to the second support 4, the first flat side plate and the second flat side plate are respectively connected to opposite sides of the flat bottom plate. The space enclosed by the flat bottom plate, the first arc-shaped side plate, the second arc-shaped side plate, the first flat side plate, and the second flat side plate is an accommodating cavity 2a.

In this embodiment, the number of layouts of the hinge assembly 1 in the foldable display device 100 may be determined according to the size of the terminal device to which the foldable display device 100 is applied. The number of layouts of the hinge assembly 1 in the foldable display device 100 may be one group, two groups, three groups, or more than three groups.

Figure 2:
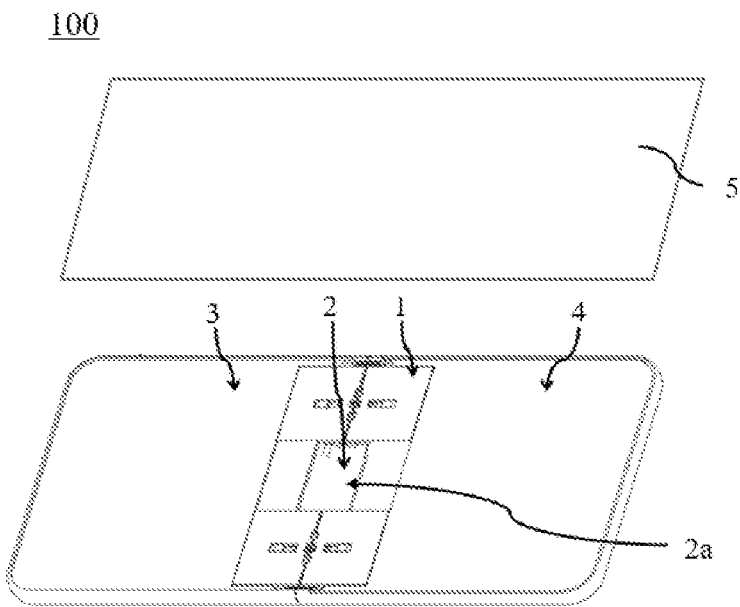
FIG. 2 is a second schematic diagram of a foldable display device according to an embodiment of this application.

Specifically, as shown in FIG. 1, when the foldable display device 100 is applied to large-size display, the foldable display device 100 includes three sets of hinge assemblies 1. The first support 3 and the second support 4 are arranged on opposite sides of the three sets of hinge assemblies 1 along the width direction of the foldable display device 100. Or, as shown in FIG. 2, when the foldable display device 100 is applied to display in a small size, the foldable display device 100 includes two sets of hinge assemblies 1. The first support 3 and the second support 4 are arranged on opposite sides of the two sets of hinge assemblies 1 along the length direction of the foldable display device 100.

In this embodiment, as shown in FIG. 3 to FIG. 12, a set of hinge assembly 1 includes a fixed assembly 10, a rotating assembly 11, a locking assembly 12, a sliding connection assembly 13, and a synchronization assembly 14.

Figure 4:
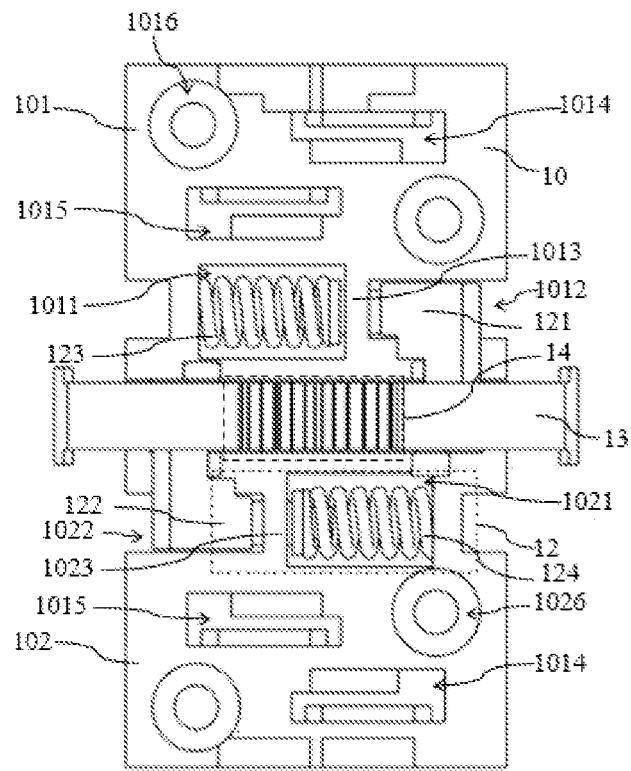
FIG. 4 is a schematic plan view of a hinge assembly when the foldable display device shown in FIG. 1 is in a flattened state.
Figure 10:
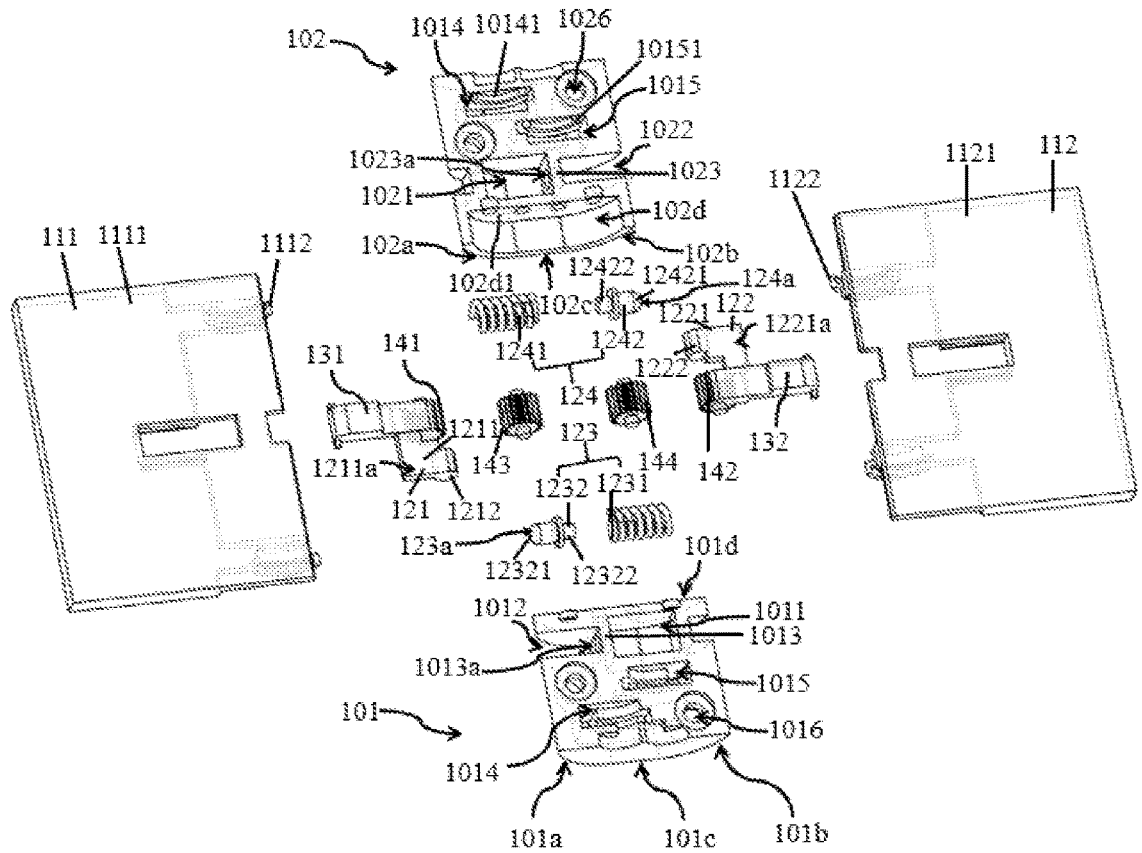
FIG. 10 is an exploded schematic view of a hinge assembly of the foldable display device shown in FIG. 1.

In this embodiment, as shown in FIG. 1 and FIG. 2, the fixing assembly 10 is disposed in the accommodating cavity 2a of the cover 2, so that the cover 2 protects the fixing assembly 10. As shown in FIG. 4 and FIG. 10, the fixing assembly 10 includes a first fixing member 101 and a second fixing member 102 disposed opposite to the first fixing member 101. The first fixing member 101 and the second fixing member 102 are arranged side by side. The first fixing member 101 and the second fixing member 102 are detachably connected to the cover 2. The outer surface of the first fixing member 101 in contact with the cover 2 is matched with the inner wall of the accommodating cavity 2a of the cover 2. The outer surface of the first fixing member 101 in contact with the cover 2 includes a first arc-shaped curved surface 101a, a second arc-shaped curved surface 101b, and a first flat surface 101c connecting the first arc-shaped curved surface 101a and the second arc-shaped curved surface 101b. The outer surface of the second fixing member 102 in contact with the cover 2 is matched with the inner wall of the accommodating cavity of the cover 2. The outer surface of the second fixing member 102 in contact with the cover 2 includes a third arc-shaped curved surface 102a, a fourth arc-shaped curved surface 102b, and a second flat surface 102c connecting the third arc-shaped curved surface 102a and the fourth arc-shaped curved surface 102b.

Please continue to refer to FIG. 4 and FIG. 10, the first fixing member 101 includes a first accommodating groove 1011, a first accommodating notch 1012, a first partition 1013, a first rotation guide groove 1014, and a second rotation guide groove 1015. The first accommodating groove 1011, the first accommodating notch 1012 and the first partition 1013 are arranged side by side in the direction in which the first support 3 points to the second support 4. The first accommodating notch 1012 is located on the side of the first partition 1013 close to the first support 3. The first partition 1013 includes a first through hole 1013a connecting the first accommodating groove 1011 and the first accommodating notch 1012. In the direction in which the first fixing member 101 points to the second fixing member 102, the second rotation guide groove 1015 of the first fixing member 101 and the first rotation guide groove 1014 of the first fixing member 101 are arranged in a staggered manner. The first rotating guide groove 1014 of the first fixing member 101 is disposed close to the first support 3. In addition, the second rotation guide groove 1015 of the first fixing member 101 is disposed close to the second support 4. In the direction in which the first fixing member 101 points to the second fixing member 102, the first rotation guide groove 1014 is located on the side of the second rotation guide groove 1015 away from the first partition 1013.

The second fixing member 102 includes a second accommodating groove 1021, a second accommodating notch 1022, a second partition 1023, a first rotation guide groove 1014, and a second rotation guide groove 1015. The second accommodating groove 1021, the second accommodating notch 1022 and the second partition 1023 are arranged side by side in the direction in which the first support 3 points to the second support 4. The second partition 1023 is disposed between the second accommodating groove 1021 and the second accommodating notch 1022. The second accommodating notch 1022 is located on the side of the second partition 1023 close to the second support 4. In addition, the second partition 1023 includes a second through hole 1023a connecting the second accommodating groove 1021 and the second accommodating notch 1022. In the direction in which the first fixing member 101 points to the second fixing member 102, the second rotation guide groove 1015 of the second fixing member 102 and the first rotation guide groove 1014 of the second fixing member 102 are arranged in a staggered manner. The first rotation guide groove 1014 of the second fixing member 102 is disposed close to the first supporting member 3. In addition, the second rotation guide groove 1015 of the second fixing member 102 is disposed close to the second support 4. In the direction in which the first fixing member 101 points to the second fixing member 102, the first rotation guide groove 1014 is located on the side of the second rotation guide groove 1015 away from the second partition 1023. In combination with the foregoing, it can be seen that the first rotation guide groove 1014 is located on the side of the second rotation guide groove 1015 away from the first partition 1013 in the direction in which the first fixing member 101 points to the second fixing member 102. In the direction in which the first fixing member 101 points to the second fixing member 102, the second rotation guide groove 1015 of the first fixing member 101 and the second rotation guide groove 1015 of the second fixing member 102 are located in inner sides of the first rotation guide groove 1014 of the first fixing member 101 and the first rotation guide groove of the second fixing member 102 1014.

In this embodiment, the first fixing member 101 further includes two first threaded holes 1016 that are staggered. The first threaded hole 1016 penetrates the first fixing member 101 in the thickness direction of the first fixing member 101. The cover 2 includes a third threaded hole (not shown) provided corresponding to the first threaded hole 1016. A first nut (not shown) is connected to the first threaded hole 1016 and a third threaded hole to fixedly connect the first fixing member 101 and the cover 2. The second fixing member 102 also includes two second threaded holes 1026 that are staggered. The second threaded hole 1026 penetrates the second fixing member 102 in the thickness direction of the second fixing member 102. The cover 2 includes a fourth threaded hole corresponding to the second threaded hole 1026. A second nut (not shown) is connected to the second threaded hole 1026 and a fourth threaded hole to fixedly connect the second fixing member 102 and the cover 2.

In this embodiment, the rotating assembly 11 includes a first rotating member 111 and a second rotating member 112. The first rotating member 111 is fixedly connected to the first support 3 in a detachable manner, he first rotating member 111 is rotatably connected with the fixing assembly 10, so that the first supporting member 3 can rotate relative to the fixing assembly 10. The second rotating member 112 and the second support 4 are detachably fixedly connected, the second rotating member 112 is rotatably connected with the fixing assembly 10, so that the second support 4 can rotate relative to the fixing assembly 10.

Figure 11:
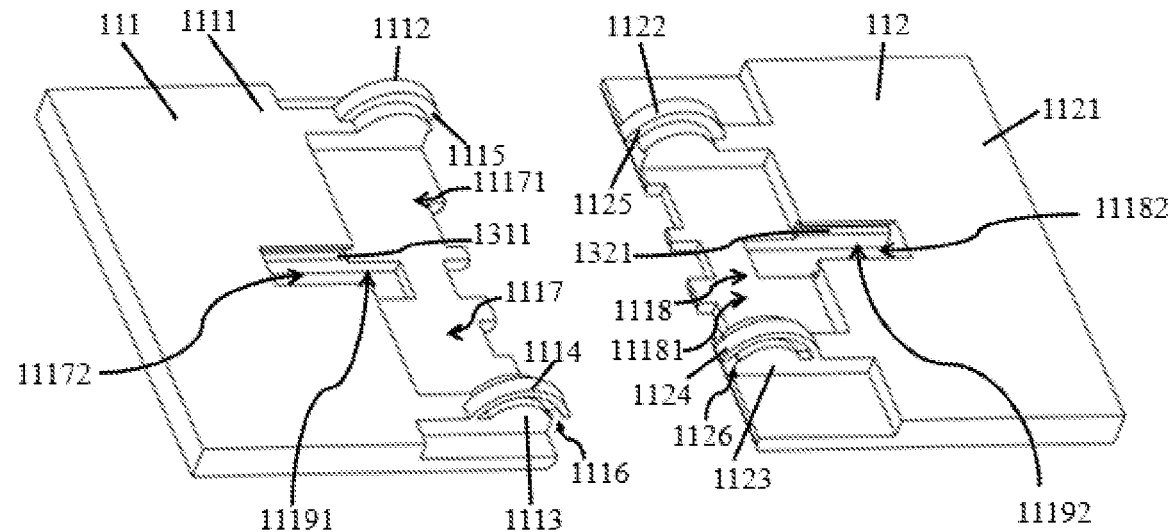
FIG. 11 is a schematic diagram of a first rotating member and a second rotating member of the hinge assembly shown in FIG. 10.

As shown in FIG. 4, FIG. 10, and FIG. 11, the first rotating member 111 includes a first plate body 1111 and two first rotating members 1112. The two first rotating members 1112 are symmetrically arranged on the surface of the first plate body 1111 close to the fixing assembly 10. The two first rotating members 1112 are respectively matched and connected with the first rotating guide groove 1014 on the first fixing member 101 and the first rotating guide groove 1014 on the second fixing member 102.

Specifically, a first arc-shaped guide portion 10141 is provided on a side wall of each first rotation guide groove 1014. Each first rotating member 1112 includes a first arc-shaped convex 1113, a first arc-shaped member 1114, a first arc-shaped side wall 1115, and a first arc-shaped opening 1116. The first arc-shaped convex 1113 and the first arc-shaped member 1114 are disposed on the surface of the first plate body 1111 close to the fixing assembly 10. One end of the first arc-shaped convex 1113 is connected to one end of the first arc-shaped member 1114. The other end of the first arc-shaped convex 1113 is disconnected from the other end of the first arc-shaped member 1114 with a gap therebetween. The first arc-shaped side wall 1115 connects the first arc-shaped convex 1113 and the first arc-shaped member 1114. The first arc-shaped convex 1113, the first arc-shaped member 1114 and the first arc-shaped side wall 1115 enclose a first arc-shaped opening 1116. The first arc-shaped opening 1116 is matched with the first arc-shaped guide portion 10141 and the first arc-shaped guide portion is clamped into the first arc-shaped opening 1116.

The second rotating member 112 includes a second plate body 1121 and two second rotating members 1122. The two second rotating members 1122 are symmetrically arranged on the surface of the second plate body 1121 close to the fixing assembly 10. The two second rotating members 1122 are respectively matched and connected with the second rotating guide groove 1015 on the first fixing member 101 and the second rotating guide groove 1015 on the second fixing member 102.

Specifically, a second arc-shaped guide portion 10151 is provided on one side wall of the second rotation guide groove 1015. The second rotating member 1122 includes a second arc-shaped convex 1123, a second arc-shaped member 1124, a second arc-shaped side wall 1125, and a second arc-shaped opening 1126. The second arc-shaped convex 1123 and the second arc-shaped member 1124 are disposed on the surface of the second plate body 1121 close to the fixing assembly 10. One end of the second arc-shaped convex 1123 is connected to one end of the second arc-shaped member 1124. The other end of the second arc-shaped convex 1123 is disconnected from the other end of the second arc-shaped member 1124 with a gap therebetween. The second arc-shaped side wall 1125 connects the second arc-shaped convex 1123 and the second arc-shaped member 1124. The second arc-shaped convex 1123, the second arc-shaped member 1124, and the second arc-shaped side wall 1125 form a second arc-shaped opening 1126. The second arc-shaped opening 1126 is matched with the second arc-shaped guide portion 10151 and the second arc-shaped guide portion 10151 is clamped into the first arc-shaped opening 1126.

Figure 5:
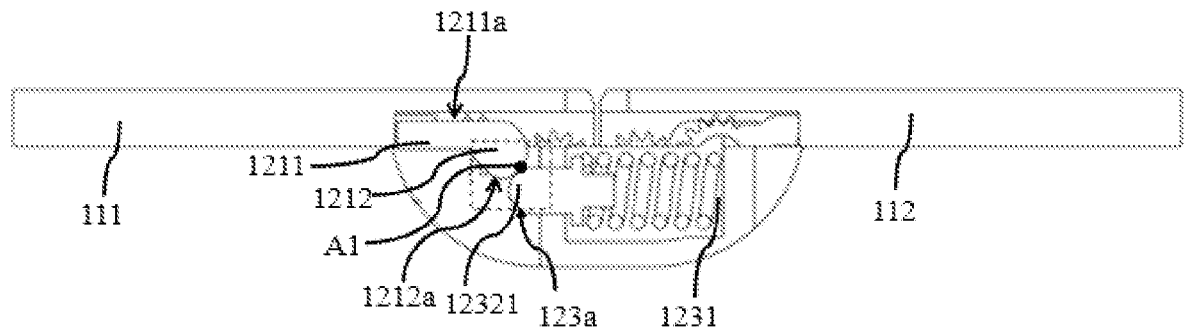
FIG. 5 is a schematic cross-sectional view of a hinge assembly when the foldable display device shown in FIG. 1 is in a flattened state.
Figure 7:
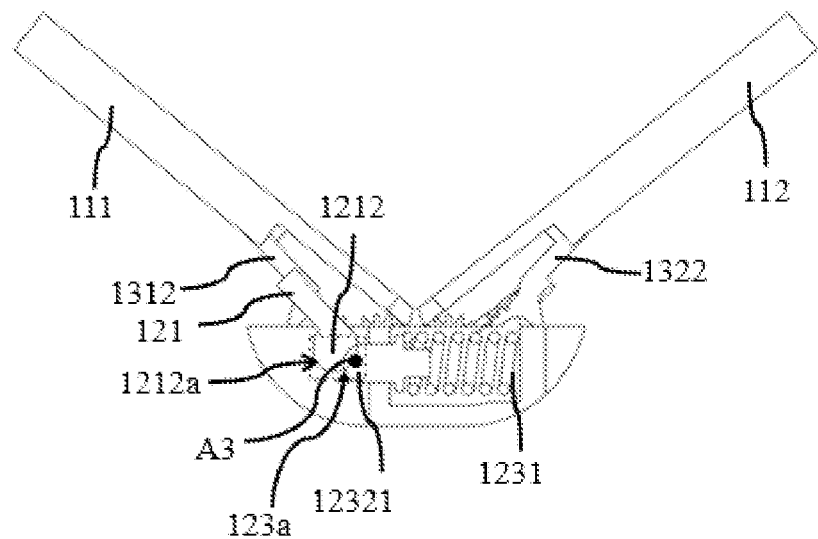
FIG. 7 is a schematic cross-sectional view of a hinge assembly when the foldable display device shown in FIG. 1 is in a first folded state.
Figure 9:
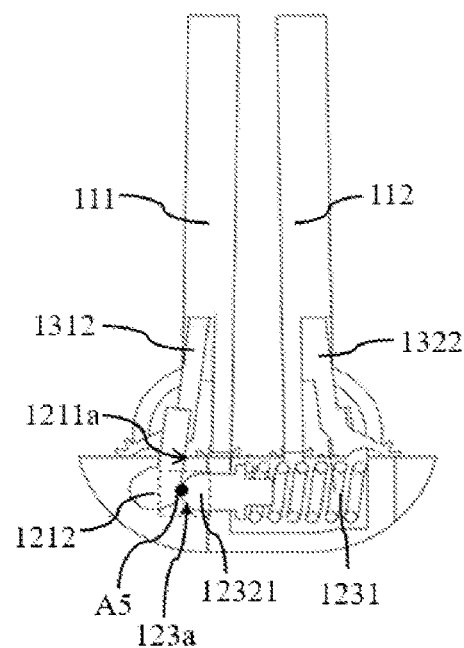
FIG. 9 is a schematic cross-sectional view of a hinge assembly when the foldable display device shown in FIG. 1 is in a second folded state.

In this embodiment, as shown in FIG. 5, when the foldable display device 100 is in a flattened state, the first arc-shaped guide portion 10141 completely rotates into the first arc-shaped opening 1116, and the second arc-shaped guide portion 10151 completely rotates into the second arc-shaped opening 1126. As shown in FIG. 7 and FIG. 9, when the foldable display device 100 is switched from the flattened state to the second folded state, the first arc-shaped guide portion 10141 rotates out of the first arc-shaped opening 1116, and the second arc-shaped guide portion 10151 rotates out of the second arc-shaped opening 1126. When the foldable display device is switched between the flattened state, the first folded state, and the second folded state, the first arc-shaped guide portion 10141 rotates along the first arc-shaped opening 1116, and the second arc-shaped guide portion 10151 rotates along the second arc-shaped opening 1126. This can stably drive the first support 3 and the second support 4 to move relative to each other, and cause the relative movement between the fixed assembly 10 and the rotating assembly 11 to produce a telescopic displacement. The displacement of the expansion and contraction change can compensate the displacement difference of the display screen of the foldable display device when it is switched between the folded state and the flattened state. When the expansion and contraction change displacement between the fixed assembly 10 and the rotating assembly 11 corresponds to the compensation required during the folding process of the display screen, it can be ensured that the hinge assembly does not cause the display screen to be squeezed or pulled when the display screen is moved.

In this embodiment, as shown in FIG. 4 and FIG. 10, the locking assembly 12 includes a first abutting member 121, a second abutting member 122, a first elastic member 123, and a second elastic member 124. The first abutting member 121 is connected to the first rotating member 111. The first abutting member 121 is disposed in the first accommodating notch 1012. When the first rotating member 111 rotates, the first abutting member 121 rotates with the first rotating member 111, and the first elastic component 123 is disposed on the fixing assembly 10. The second abutting member 122 is connected to the second rotating member 112. The second abutting member 122 is disposed in the second accommodating notch 1022. When the second rotating member 112 rotates, the second abutting member 122 rotates with the second rotating member 112, and the second elastic component 124 is disposed on the fixing assembly 10.

When the foldable display device is in a preset state, the first elastic assembly 123 and the first abutting member 121 abut against each other, and the second elastic assembly 124 and the second abutting member 122 abut against each other. The preset state includes at least one of a flattened state, a first folded state, and a second folded state. Specifically, the preset state includes a flattened state, a first folded state, and a second folded state.

When the foldable display device of this embodiment is in a preset state, a holding force is generated by abutting between the first abutting member 121 and the first elastic assembly 123 provided on the fixing assembly 10. The combined first elastic assembly 123 has elasticity, so that the angle between the first rotating member 111 connected to the first abutting member 121 and the fixing assembly 10 can be stably maintained within a certain angle range (greater than or equal to 0 degrees and less than or equal to 90 degrees) under the action of the retaining force. In turn, the angle between the first support 3 and the fixing assembly 10 can be stably maintained when the angle is within a certain range (greater than or equal to 0 degrees and less than or equal to 90 degrees). In addition, the second abutting member 122 and the second elastic assembly 124 disposed on the fixing assembly 10 abut against each other to generate a holding force. The second elastic assembly has elasticity, so that the angle between the second rotating member 112 connected to the second abutting member 122 and the fixing assembly 10 is within a certain angle (greater than or equal to 0 degrees and less than or equal to 90 degrees). It can be stably maintained under the action of holding force. In turn, the angle between the second support 4 and the fixing assembly 10 can be maintained even when the angle is within a certain angle (greater than or equal to 0 degrees and less than or equal to 90 degrees). Correspondingly, when the foldable display device is parked in any one flattened state, any state of the foldable display device can be stably maintained without external force. Only when sufficient external force is applied to at least one of the first support 3 and the second support 4, the stable state of the foldable display device under the holding force will change. In addition, the retention force is generated by the abutting force between the first abutting member 121 and the first elastic assembly 123 and the abutting force between the second abutting member 122 and the second elastic assembly 124, which can prevent the foldable display device from being unfolded. There is a noise during the peaceful folding process.

In this embodiment, as shown in FIG. 10, the first elastic assembly 123 has a third convex abutting surface 123a. The first elastic assembly 123 includes a first elastic member 1231 and a first moving member 1232. The first moving member 1232 has a first end and a second end opposite to each other. The first elastic member 1231 is disposed in the first accommodating groove 1011 of the first fixing member. The first moving member 1232 passes through the first through hole 1013a. The first end of the first moving member 1232 is connected to the first elastic member 1231. The second end of the first moving member 1232 includes a third convex abutting surface 123a. The third convex abutting surface 123a is used for abutting against the first abutting member 121 located in the first accommodating notch 1012.

Specifically, the first moving member 1232 is a first thimble, and the first elastic member 1231 is a first spring. The first thimble is hat-shaped. The first thimble includes a first convex curved portion 12321 and a first rod 12322 connected to the first convex curved portion 12321. The first spring is sleeved on the first rod 12322. The first convex curved portion 12321 includes a third convex abutting surface 123a. The third convex abutting surface 123a includes an arc-shaped curved surface. For example, when the first convex curved portion 12321 is hemispherical, the third convex abutting surface 123a is a spherical curved surface. The third convex abutting surface 123a of the first convex curved portion 12321 is used for abutting against the first abutting member 121.

In this embodiment, the second elastic assembly 124 has a fourth convex abutting surface 124a. The second elastic assembly 124 includes a second elastic member 1241 and a second moving member 1242. The second moving member 1242 has a first end and a second end opposite to each other. The second elastic member 1241 is disposed in the second accommodating groove 1021 of the second fixing member. The second moving member 1242 passes through the second through hole 1023a. The first end of the second moving member 1242 is connected to the second elastic member 1241. The second end of the second moving member 1242 has a fourth convex abutting surface 124a. The fourth convex abutting surface 124a is used for abutting against the second abutting member 122 located in the second accommodating notch 1022.

Specifically, the second moving member 1242 is a second thimble. The second elastic member 1241 is a second spring. The second thimble is the same as the first thimble, and the second spring is the same as the first spring. The second thimble includes a second convex curved portion 12421 and a second rod 12422 connected to the second convex curved portion 12421. The second spring is sleeved on the second rod 12422. The second convex curved portion 12421 includes a fourth convex abutting surface 124a. The fourth protrusion abutting surface 124a includes an arc-shaped curved surface. When the second convex curved portion 12421 is hemispherical, the fourth convex abutting surface 124a is a spherical curved surface. The fourth convex abutting surface 124a of the second convex curved portion 12421 is used for abutting against the second abutting member 122 located in the second accommodating notch 1022.

Figure 12:
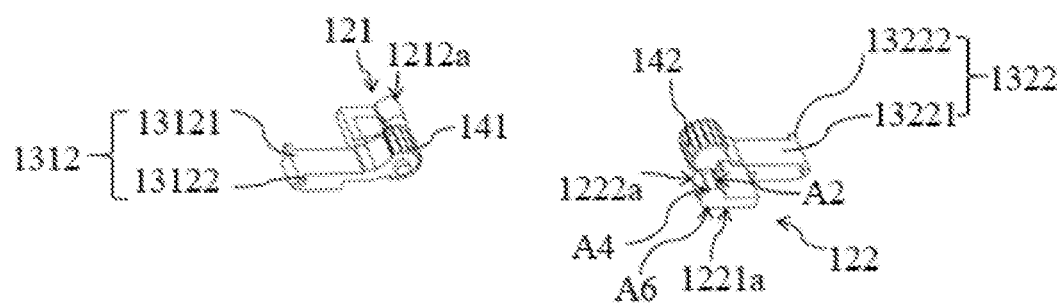
FIG. 12 is a schematic diagram of a first sliding block and a second sliding block of the hinge assembly shown in FIG. 10.

In this embodiment, as shown in FIG. 10 and FIG. 12, the first abutting member 121 has a first convex abutting surface 1212a. The first abutting member 121 includes a first flat portion 1211 and a first convex 1212 connected to the first flat portion 1211. The first flat portion 1211 is connected to the first rotating member 111. Specifically, the first flat portion 1211 has a first flat abutting surface 1211a close to the first rotating member 111. The first flat abutting surface 1211a has a flat surface. The first convex portion 1212 has a first convex abutting surface 1212a connected to the first flat abutting surface 1211a. The first convex abutting surface 1212a at least includes an arc-shaped curved surface, and the arc-shaped curved surface may be a circular arc-shaped curved surface or an elliptical arc-shaped curved surface. The first convex abutting surface 1212a may also include a flat surface.

In this embodiment, the second abutting member 122 has a second convex abutting surface 1222a. The second abutting member 122 includes a second flat portion 1221 and a second convex 1222 connected to the second flat portion 1221. The second flat portion 1221 is connected to the second rotating member 112. The second flat portion 1221 is the same as the first flat portion 1211. The second convex 1222 is the same as the first convex 1212. Specifically, the second flat portion 1221 has a second flat abutting surface 1221a close to the second rotating member 112. The second flat abutting surface 1221a has a flat surface. The second convex portion 1222 has a second convex abutting surface 1222a connected to the second flat abutting surface 1221a. The second convex abutting surface 1222a at least includes an arc-shaped curved surface. The arc-shaped curved surface can be a circular arc-shaped curved surface or an elliptical arc-shaped curved surface. The second convex abutting surface 1222a may also include a flat surface.

Figure 3:
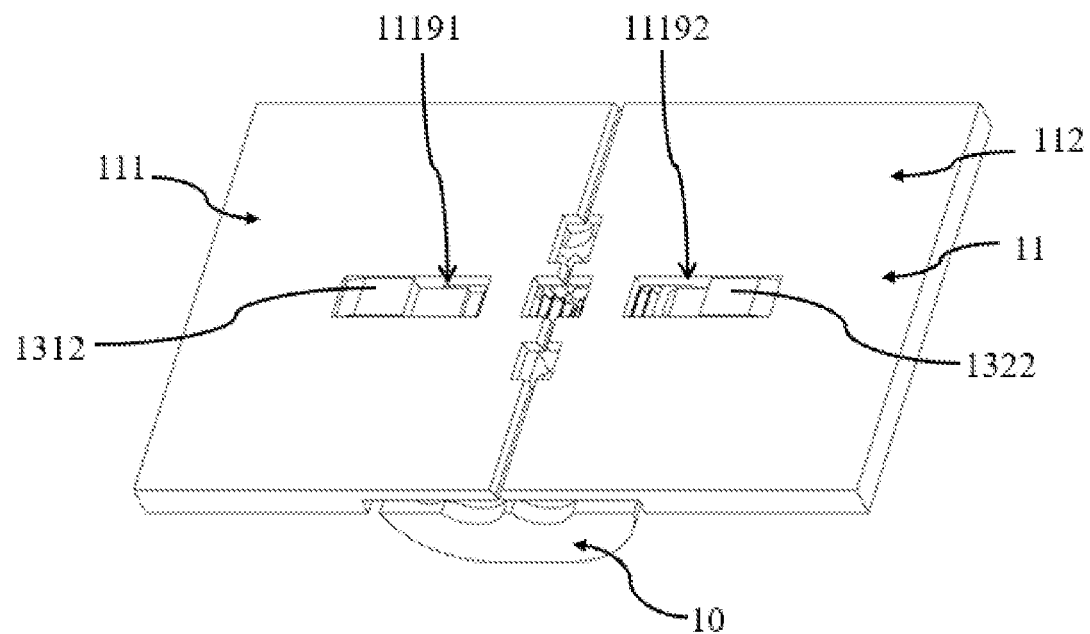
FIG. 3 is a perspective view of a hinge assembly when the foldable display device shown in FIG. 1 is in a flattened state.

In this embodiment, as shown in FIG. 3, FIG. 5, and FIG. 12. When the foldable display device 100 is in a flat state, the first position A1 of the first convex abutting surface 1212a of the first abutting member 121 contacts the third convex abutting surface 123a of the first elastic assembly 123. The second position A2 of the second convex abutting surface 1222a of the second abutting member 122 is in contact with the fourth convex abutting surface 124a. Further, the first elastic member 1231 of the first elastic assembly 123 and the second elastic member 1241 of the second elastic assembly 124 both have the first deformation amount. The first convex abutting surface 1212a is the same as the second convex abutting surface 1222a. The position of the first position A1 on the second convex abutting surface 1222a is the same as the position of the second position A2 on the second convex abutting surface 1222a.

Specifically, when the foldable display device is in a flattened state, the third convex abutting surface 123a of the first convex curved portion 12321 of the first thimble is tangent to the first position A1 on the first convex abutting surface 1212a to achieve arc-shaped interlocking. The fourth convex abutting surface 124a of the second convex curved portion 12421 of the second thimble is tangent to the second position A2 on the second convex abutting surface 1222a to achieve interlocking. The arc interlocking ensures the stability of the foldable display device in the flat state. Further, the first deformation of the first spring and the first deformation of the second spring are both 0, that is, both the first spring and the second spring are in a natural state.

Figure 6:
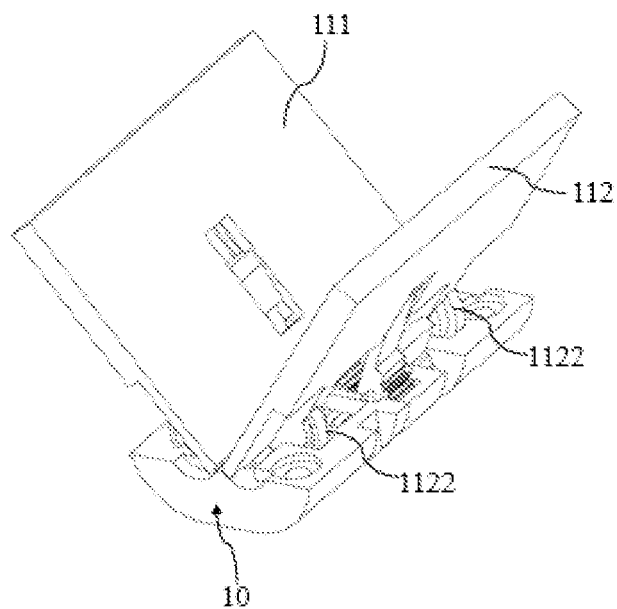
FIG. 6 is a perspective schematic view of a hinge assembly when the foldable display device shown in FIG. 1 is in a first folded state.

In this embodiment, as shown in FIG. 6, FIG. 7, and FIG. 12, when the foldable display device is in the first folded state, the third convex abutting surface 123a of the first elastic assembly 123 abuts the third position A3 of the first convex abutting surface 1212a of the first abutting member 121. The first elastic member 1231 has a second deformation amount. The fourth convex abutting surface 124a of the second elastic assembly 124 abuts against the fourth position A4 of the second convex abutting surface 1222a of the second abutting member 122. The second elastic member 1241 has a third deformation amount. At least one of the second deformation amount and the third deformation amount may both be different from the first deformation amount.

The position of the third position A3 on the first convex abutting surface 1212a of the first abutting member 121 is the same as the position of the fourth position A4 on the second convex 1222. The position of the first position A1 on the first convex abutting surface 1212a is different from the position of the third convex A3 on the first convex abutting surface 1212a. The position of the second position A2 on the second convex abutting surface 1222a is different from the position of the fourth position A4 on the second convex abutting surface 1222a. The second deformation amount is equal to the third deformation amount, and the second deformation amount and the third deformation amount are different from the first deformation amount. It can be understood that the second deformation amount may not be equal to the third deformation amount, for example, the second deformation amount is greater than the third shape amount. Alternatively, the third deformation amount is greater than the second deformation amount, specifically because the angle at which the first support 3 rotates relative to the fixing assembly 10 is different from the angle at which the second support 4 rotates relative to the fixing assembly 10.

Specifically, the first convex curved portion 12321 of the first thimble and the third position A3 on the first convex abutting surface 1212a are mutually squeezed to achieve arc-shaped interlocking. The first spring is deformed under the action of the squeezing force, and the second deformation amount is greater than zero. The second convex curved portion 12421 of the second thimble and the fourth position A4 on the second convex abutting surface 1222a are squeezed mutually to achieve arc-shaped interlocking. The second spring deforms under the action of the squeezing force, and the third deformation amount is greater than zero. The mutual squeezing force enables the foldable display device to stably park at any angle in the first folded state. Therefore, when the foldable display device is in the first folded state, the second and third deformation amounts are both larger than the first deformation amount. It is understandable that one of the second deformation amount and the third deformation amount may be greater than the first deformation amount, and the other of the second deformation amount and the third deformation amount is equal to the first deformation amount.

It should be noted that, in FIG. 7, the position of the first convex curved portion 12321 of the first thimble is shown to be stationary. The amount of interference formed between the first convex portion 1212 and the first convex curved portion 12321 when the foldable display device is in the first folded state (the intersecting portion between the first convex portion 1212 and the first convex curved portion 12321). The amount of interference causes the first convex curved portion 12321 of the first thimble to move toward the first spring, and the first thimble compresses the first spring to generate a second deformation greater than zero. Further, the second thimble compresses the second spring to generate a third deformation greater than zero.

When the foldable display device of the present application is in the flattened state and the first folded state, locking assemblies abut between the first convex abutting surface of the first abutting member and the third convex abutting surface of the first elastic assembly, and the second convex abutting surface of the second abutting member abuts against the fourth convex abutting surface of the second elastic assembly. In this way, both the flattened state and the first folded state of the foldable display device can be stably maintained. In addition, when the foldable display device is switched between the flattened state and the first folded state, the third convex abutting surface of the first elastic assembly is always in contact with one first convex abutting surface. The fourth convex abutting surface of the second elastic assembly is always in contact with a second convex abutting surface. This is conducive to achieving a smooth transition between the flattened state and the first folded state, and this can ensure a smooth folding experience. Compared with a conventional ball head into a hole and a side force is applied, it can avoid a sudden knocking sound of the hole.

In this embodiment, the arc-shaped curved surface of the first convex abutting surface 1212a includes at least one of the first position A1 and the third position A3. The arc-shaped curved surface of the second convex abutting surface 1222a includes at least one of the second position A2 and the fourth position A4. When the foldable display device is in the flattened state and the first folded state. The arc-shaped curved surface of the third convex abutting surface 123a is in contact with the first convex abutting surface 1212a. In addition, the arc-shaped curved surface of the fourth convex abutting surface 124a is in contact with the second convex abutting surface 1222a. This further ensures that the foldable display device can transition smoothly when switching between the flattened state and the first folded state. Specifically, the arc-shaped curved surface of the first convex abutting surface 1212a includes a first position A1 and a third position A3. The arc-shaped curved surface of the second convex abutting surface 1222a includes a second position A2 and a fourth position A4.

It should be noted that when the foldable display device is switched between the flattened state and the first folded state. The design of the first convex curved portion 12321 of the first moving member 1232 and the second convex curved portion 12421 of the second moving member 1242. This enables the change of the abutting process between the first convex curved portion 12321 and the first abutting member 121 to be smoothly transitioned through the curved surface. The change in the abutment process between the second convex curved portion 12421 and the second abutting member 122 can also be smoothly transitioned through the curved surface, to further ensure a smooth folding experience. Compared with the conventional ball head into the hole and the side force is applied, it can avoid the sudden knocking sound of the hole. In addition, the first moving member 1232 and the second moving member 1242 move in the first fixing member 101 and the second fixing member 102, respectively, without participating in the rotation movement. The direction in which the first moving member 1232 compresses the first elastic member 1231 is the same as the rotation direction of the first support 3. The direction in which the second moving member 1242 compresses the second elastic member 1241 is the same as the rotation direction of the second support 4. The first elastic member 1231 and the second elastic member 1241 are better subjected to the force following the rotation direction of the first support 3 and the second support 4.

Figure 8:
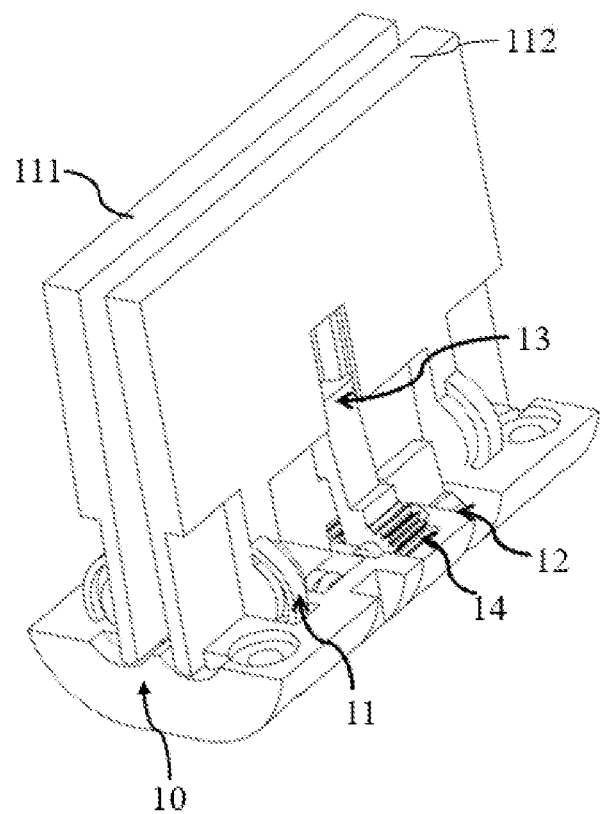
FIG. 8 is a perspective schematic view of a hinge assembly when the foldable display device shown in FIG. 1 is in a second folded state.

In this embodiment, as shown in FIG. 8, FIG. 9, and FIG. 12, when the foldable display device is in the second folded state, the third convex abutting surface 123a of the first elastic assembly 123 is in contact with the fifth position A5 of the first flat portion 1211. The first elastic member 1231 of the first elastic assembly 123 has a fourth deformation amount. The fourth convex abutting surface 124a of the second elastic assembly 124 is in contact with the sixth position A6 of the second flat portion 1221. The second elastic member 1241 of the second elastic assembly 124 has a fourth deformation amount. The position of the fifth position A5 on the first flat portion 1211 is the same as the position of the sixth position A6 on the second flat portion 1221. At least one of the second deformation amount and the third deformation amount is different from the fourth deformation amount. For example, at least one of the second deformation amount and the third deformation amount is greater than the fourth deformation amount.

Specifically, when the foldable display device is in the second folded state, the third convex abutting surface 123a of the first convex curved portion 12321 of the first thimble is tangent to the fifth position A5 on the first flat abutting surface 1211a of the first flat portion 1211 to achieve arc interlocking. The fourth deformation amount of the first spring is equal to the first deformation amount of the first spring, that is, the fourth deformation amount is zero. The first spring is in its natural state. The fourth convex abutting surface 124a of the second convex curved portion 1221 of the second thimble is tangent to the sixth position A6 of the second straight abutting surface 1221a of the second flat portion 1221 to achieve arc interlocking. The fourth deformation amount of the second spring is equal to the first deformation amount of the second spring, that is, the second spring is in a natural state. Through the arc interlocking, the foldable display device can be stably maintained in the second folded state. In addition, the design of the first flat abutting surface 1211a and the second flat abutting surface 1221a prevents the folding angle of the foldable display device from changing when the foldable display device is in the second folded state.

In this embodiment, both the first support 3 and the second support 4 are provided with magnetic members (not shown). When the foldable display device is in a fully folded state, the magnetic members on the first support and the second support attract each other. The first moving member 1232 of the first elastic assembly is separated from the first abutting member 121. The second moving member 1242 of the second elastic assembly is separated from the second abutting member 122. This enables the foldable display device to remain closed stably without external force. The design of the magnetic member on the support is the prior art, and this will not be described in detail here. The foldable display device needs to be switched to the fully folded state through the second folding state. When the foldable display device is in a fully folded state, the foldable display device may be in a wedge-shaped folding or a drop-shaped folding.

The locking assembly of this embodiment can stably maintain the flattened state, the first folded state, and the second folded state of the foldable display device through abutment. In addition, the foldable display device can realize parking at multiple folding angles, which solves the problem that the traditional technology can only park at a single angle. In addition, the design of the locking assembly enables the foldable display device to transition smoothly when switching between the flattened state and the first folded state, avoiding the sound problem caused by the conventional locking assembly.

In this embodiment, as shown in FIG. 10 to FIG. 12, the sliding connection assembly 13 includes a first sliding member 131 and a second sliding member 132. The first sliding member 131 slidably connects the first rotating member 111 and the first abutting member 121. The second sliding member 132 slidably connects the second rotating member 112 and the second abutting member 122. The first sliding member 131 includes a first sliding rail 1311 disposed on the first rotating member 111 and a first sliding block 1312 matched with the first sliding rail 1311. The first abutting member 121 is connected to a side of the first sliding block 1312 close to the first fixing member 101. The second sliding member 132 includes a second sliding rail 1321 disposed on the second rotating member 112 and a second sliding block 1322 matched with the second sliding rail 1321. The second abutting member 122 is connected to a side of the second sliding block 1322 close to the second fixing member 102.

Specifically, a first T-shaped groove 1117 is provided on the surface of the first plate body 1111 close to the fixing assembly 10. The depth of the first T-shaped groove 1117 is smaller than the thickness of the first plate body 1111 of the first rotating member. The first T-shaped groove 1117 includes a first 1 transverse groove 11171 and a first longitudinal groove 11172. The first transverse groove 11171 is disposed between the two first rotating members 1112. The first longitudinal groove 11172 is perpendicular to the first transverse groove 11171. The first plate body 1111 further includes a first limiting hole 11191. The first limiting hole 11191 extends from the first longitudinal groove 11172 to the first transverse groove 11171. The first limiting hole 11191 penetrates the first plate body 1111 of the first rotating member in the thickness direction of the first plate body 1111. A first sliding rail 1311 is respectively provided on both sides of the first limiting hole 11191. The first sliding block 1312 includes a first slider body 13221 and two first sliding rods 13222 connected to opposite sides of the first slider body 13221. The two first sliding rods 13222 are respectively slid on the two first sliding rails 1311 and along the first sliding rail 1311. The first slider body 13221 is located in the first limiting hole 11191. The length of the first slider body 13221 is smaller than the length of the first limiting hole 11191 to limit the sliding distance of the first slider body 13221.

In addition, a second T-shaped groove 1118 is provided on the surface of the second plate body 1121 close to the fixing assembly 10. The depth of the second T-shaped groove 1118 is smaller than the thickness of the second plate body 1121 of the second rotating member. The second T-shaped groove 1118 includes a second transverse groove 11181 and a second longitudinal groove 11182. The second transverse groove 11181 is disposed between the two second rotating members 1122. The second longitudinal groove 11182 is perpendicular to the second transverse groove 11181. The second rotating member 112 further includes a second limiting hole 11192 extending from the second longitudinal groove 11182 to the second transverse groove 11181. The second limiting hole 11192 penetrates the second plate body 1121 of the second rotating member in the thickness direction of the second plate body 1121. A second sliding rail 1321 is respectively provided on two opposite sides of the second limiting hole 11192. The second sliding block 1322 includes a second slider body 13221 and two second sliding rods 13222 connected to opposite sides of the second slider body 13221. The second slider body 13221 is disposed in the second limiting hole 11192. The two second sliding rods 13222 are respectively slid on the two second sliding rails 1321 and along the second sliding rails 1321. The second slider body 13221 is located in the second limiting hole 11192. The length of the second slider body 13221 is smaller than the length of the second limiting hole 11192 to limit the sliding distance of the second slider body 13221.

The sliding connection assembly of this embodiment slidably connects the first abutting member and the first rotating member, and slidably connects the second abutting member and the second rotating member. Thereby compensating the displacement difference between the first abutting member and the first rotating member during the rotation and compensating the displacement difference between the first abutting member and the first rotating member during the rotation, and improving the overall stability of the hinge assembly.

In this embodiment, as shown in FIG. 4 and FIG. 10, the synchronization assembly 14 includes a first gear 141, a second gear 142, a first synchronization wheel 143, and a second synchronization wheel 144. The first gear 141, the first synchronization gear 143, the second synchronization gear 144, and the second gear 142 are arranged in sequence. The first gear 141 is connected with the first sliding block 1312 and the first abutting member 121. The first abutting member 121 is located on a side of the first gear 141 close to the first fixing member 101. In addition, the first gear 141 is rotatably connected with the first fixing member 101. The second gear 142 is connected with the second sliding block 1322 and the second abutting member 122. The second abutting member 122 is located on a side of the second gear 142 close to the second fixing member 102, and the second gear 142 is rotatably connected with the second fixing member 102. The first synchronization wheel 143 meshes with the first gear 141 and is rotatably connected with the first fixing member 101 and the second fixing member 102. The second synchronization wheel 144 meshes with the first synchronization wheel 143 and the second gear 142 and is rotatably connected with the first fixing member 101 and the second fixing member 102. The first gear 141 is the same as the second gear 142, and the first synchronization wheel 143 is the same as the second synchronization wheel 144.

Specifically, the first fixing member 101 includes a third accommodating notch 101*d* close to the second fixing member 102. The third accommodating notch 101*d* has a first side wall facing the second fixing member 102. The second fixing member 102 includes a fourth accommodating notch 102*d* close to the first fixing member 101. The fourth accommodating notch 102*d* has a second side wall 102*d*1 facing the first fixing member 101. The first side wall of the third accommodating notch 101*d* and the second side wall 102d1 of the fourth accommodating notch 102d each include a first mounting hole, a second mounting hole, a third mounting hole, and a fourth mounting hole arranged in sequence. A first mounting hole, a second mounting hole, a third mounting hole, and a fourth mounting hole are identical and arranged in an arc. The first mounting hole is arranged close to the first rotating member 111. The fourth mounting hole is disposed close to the second rotating member 112. The first gear 141, the second gear 142, the first synchronization wheel 143, and the second synchronization wheel 144 are arranged in the space enclosed by the third accommodating notch 101d and the fourth accommodating notch 102d. A rotating shaft of the first gear 141 is inserted into the first mounting hole of the second side wall 101d2. A rotating shaft of the second gear is inserted into the fourth mounting hole of the first side wall. The two rotating shafts of the first synchronization wheel 143 are respectively inserted into the second mounting hole of the first side wall and the second mounting hole of the second side wall 102dl. The two rotating shafts of the second synchronization wheel 144 are respectively inserted into the third mounting hole of the first side wall and the third mounting hole of the second side wall 102dl.

In this embodiment, the synchronization assembly drives the first rotating member and the second rotating member of the rotating assembly to rotate synchronously through the sliding connection part. In turn, the first support and the second support rotate synchronously. In addition, both the first gear and the first abutting member of the synchronization assembly are integrally connected with the first sliding block. Both the second gear and the second abutting member are integrally connected with the second sliding block, so that the hinge assembly has a high degree of integration.

It should be noted that the hinge assembly of the foldable display device of this embodiment is highly integrated, is an independent assembly, has high flexibility, small size, does not occupy equipment space, and can be assembled into terminal equipment, which is very convenient. Further, through the guiding transition design of the spring and thimble locking process, the problems of uneven force and stress concentration are solved, and the life of the foldable device is improved.

The descriptions of the above embodiments are only used to help understand the technical solutions and core ideas of the present application. Those of ordinary skill in the art should understand that they can still modify the technical solutions described in the foregoing embodiments, or equivalently replace some of the technical features. However, these modifications or replacements do not cause the essence of the corresponding technical solutions to deviate from the scope of the technical solutions of the embodiments of the present application.

What is claimed is:

1. A foldable display device, wherein the foldable display device comprises a hinge assembly, a first support, a second support, and a display screen, the hinge assembly is connected between the first support and the second support, the display screen is located on the first support, the second support, and the hinge assembly, and the hinge assembly comprises: a fixing assembly; a rotating assembly, wherein the rotating assembly comprises: a first rotating member connected to the first support and rotatably connected to the fixing assembly; a second rotating member connected with the second support and rotatably connected to the fixing assembly; and a locking assembly, wherein the locking assembly comprises: a first abutting member connected to the first rotating member, wherein when the first rotating member rotates, the first abutting member rotates with the first rotating member; a second abutting member connected to the second rotating member, wherein when the second rotating member rotates, the second abutting member rotates with the second rotating member; a first elastic assembly disposed on the fixing assembly; and a second elastic assembly disposed on the fixing assembly; wherein when the foldable display device is in a preset state, the first elastic assembly and the first abutting member abut against each other, and the second elastic assembly and the second abutting member abut against each other; wherein the preset state comprises a flattened state, a first folded state, and a second folded state, the first folded state is a transition state between the flattened state and the second folded state, and an angle between the first support and the second support of the foldable display device in the first folded state is greater than 0 degrees and less than 180 degrees; the first abutting member has a first convex abutting surface, and the second abutting member has a second convex abutting surface; the first elastic assembly has a third convex abutting surface, and the second elastic assembly has a fourth convex abutting surface; wherein when the foldable display device is in the flattened state, a first position of the first convex abutting surface is in contact with the third convex abutting surface, and a second position of the second convex abutting surface is in contact with the fourth convex abutting surface; when the foldable display device is in the first folded state, a third position of the first convex abutting surface abuts the third convex abutting surface, a fourth position of the second convex abutting surface abuts the fourth convex abutting surface, the first position is different from the third position, and the second position is different from the fourth position.

2. The foldable display device according to claim 1, wherein the first convex abutting surface and the second convex abutting surface both comprise arc-shaped curved surfaces, and the third convex abutting surface and the fourth convex abutting surface both comprises arc-shaped curved surfaces;

wherein the arc-shaped curved surface of the first convex abutting surface comprises at least one of the first position and the third position, and the arc-shaped curved surface of the second convex abutting surface comprises at least one of the second position and the fourth position;

when the foldable display device is in the flattened state and the first folded state, the arc-shaped curved surface of the third convex abutting surface is in contact with the first convex abutting surface, and the arc-shaped curved surface of the fourth convex abutting surface is in contact with the second convex abutting surface.

3. The foldable display device according to claim 1, wherein the first abutting member further has a first flat abutting surface connected to the first convex abutting surface, the second abutting member further has a second flat abutting surface connected to the second convex abutting surface, the first flat abutting surface is located on a side of the first abutting member close to the first rotating member, and the second flat abutting surface is located on a side of the second abutting member close to the second rotating member;

when the foldable display device is in the second folded state, an angle between the first support and the second support is equal to 0 degrees, the first flat abutting surface is in contact with the third convex abutting surface, and the second flat abutting surface is in contact with the fourth convex abutting surface.

4. The foldable display device according to claim 3, wherein the first abutting member comprises a first flat portion and a first convex portion connected to the first flat portion, the first flat portion is connected to the first rotating member, the first convex portion comprises the first convex abutting surface, and the first flat portion comprises the first flat abutting surface.

5. The foldable display device according to claim 1, wherein when the foldable display device is in the flattened state, the first elastic assembly and the second elastic assembly both have a first deformation amount;
when the foldable display device is in the first folded state, the first elastic assembly has a second deformation amount, the second elastic assembly has a third deformation amount, and at least one of the second deformation amount and the third deformation amount is different from the first deformation amount.

6. The foldable display device according to claim 5, wherein when the foldable display device is in the second folded state, an angle between the first support and the second support is equal to 0 degrees, the first elastic assembly and the second elastic assembly both have a fourth deformation amount, and at least one of the second deformation amount and the third deformation amount is different from the fourth deformation amount.

7. The foldable display device according to claim 6, wherein at least one of the second deformation amount and the third deformation amount is greater than the first deformation amount;
at least one of the second deformation amount and the third deformation amount is greater than the fourth deformation amount;
the fourth deformation amount is equal to the first deformation amount, and the first deformation amount and the fourth deformation amount are both equal to zero.

8. The foldable display device according to claim 1, wherein the fixing assembly comprises a first fixing member and a second fixing member disposed opposite to the first fixing member;
the first elastic assembly comprises a first elastic member and a first moving member, the first elastic member is disposed in the first fixing member, the first elastic member is connected to the first moving member, and the first moving member comprises the third convex abutting surface;
the second elastic assembly comprises a second elastic element and a second moving element, the second elastic assembly is disposed in the second fixing member, the second elastic member is connected to the first moving member, and the second moving member comprises the fourth convex abutting surface.

9. The foldable display device according to claim 8, wherein the first moving member is a first thimble, the first elastic member is a first spring, the first thimble comprises a first convex curved surface portion and a first rod connected to the first convex curved surface portion, the first spring is sleeved on the first rod, and the first convex curved surface portion comprises the third convex abutting surface;
the second moving member is a second thimble, the second elastic member is a second spring, the second thimble comprises a second convex curved surface portion and a second rod connected to the second convex curved surface portion, the second spring is sleeved on the second rod, and the second convex curved surface portion comprises the fourth convex abutting surface.

10. The foldable display device according to claim 8, wherein the first fixing member comprises a first accommodating groove, a first accommodating notch, and a first partition, the first accommodating groove, the first accommodating notch, and the first partition are disposed side by side in a direction in which the first support points to the second support, the first partition is disposed between the first accommodating groove and the first accommodating notch, the first accommodating notch is located on a side of the first partition close to the first support, and the first partition comprises a first through hole communicating with the first accommodating groove and the first accommodating notch;
wherein the first abutting member is disposed in the first accommodating notch, the first elastic member is arranged in the first accommodating groove, the first moving member passes through the first through hole, a first end of the first moving member is connected to the first elastic member, a second end of the first moving member comprises the third convex abutting surface, and the first end of the first moving member is opposite to the second end of the first moving member;
the second fixing member comprises a second accommodating groove, a second accommodating notch, and a second partition, the second accommodating groove, the second accommodating notch, and the second partition are disposed side by side in a direction in which the first support points to the second support, the second partition is disposed between the second accommodating groove and the second accommodating notch, the second accommodating notch is located on a side of the second partition close to the second support, and the second partition comprises a second through hole communicating with the second accommodating groove and the second accommodating notch;
wherein the second abutting member is disposed in the second accommodating notch, the second elastic member is disposed in the second accommodating groove, the second moving member passes through the second through hole, a first end of the second moving member is connected to the second elastic member, a second end of the second moving member comprises the fourth convex abutting surface, and the first end of the second moving member is opposite to the second end of the second moving member.

11. The foldable display device according to claim 8, wherein the first fixing member comprises a first rotation guide groove and a second rotation guide groove disposed in an offset position with the first rotation guide groove, the second fixing member comprises one first rotation guide groove and one second rotation guide groove, the first rotation guide grooves on the first fixing member and the second fixing member are disposed close to the first support, the second rotation guide grooves on the first fixing member and the second fixing member are disposed close to the second support, and in a direction in which the first fixing member points to the second fixing member, the second rotation guide groove of the first fixing member and the second rotation guide groove of the second fixing member are located at inner sides of the first rotation guide groove of the first fixing member and the first rotation guide groove of the second fixing member;
the first rotating member comprises a first plate body and two first rotating members, the two first rotating members are located on a surface of the first plate body close to the fixing assembly, the two first rotating members are respectively matched and connected with the first rotating guide groove on the first fixing member and the first rotating guide groove on the second fixing member;

the second rotating member comprises a second plate body and two second rotating members, the two second rotating members are located on a surface of the second plate body close to the fixing assembly, and the two second rotating members are respectively matched and connected with the second rotating guide groove on the first fixing member and the second rotating guide groove on the second fixing member.

12. The foldable display device according to claim 11, wherein a first arc-shaped guide portion is provided on a side wall of the first rotation guide groove, the first rotating member comprises a first arc-shaped opening that cooperates with the first arc-shaped guide portion, and the first arc-shaped guide portion is clamped into the first arc-shaped opening, a second arc-shaped guide portion is provided on a side wall of the second rotation guide groove, the second rotating member comprises a second arc-shaped opening that cooperates with the second arc-shaped guide portion, and the second arc-shaped guide portion is clamped into the second arc-shaped opening.

13. The foldable display device according to claim 1, wherein the fixing assembly comprises a first fixing member and a second fixing member disposed opposite to the first fixing member;

the hinge assembly further comprises a sliding connection assembly, wherein the sliding connection assembly comprises:

a first sliding member slidably connecting the first abutting member and the first rotating member and comprising a first sliding rail disposed on the first rotating member and a first sliding block matched with the first sliding rail, wherein the first abutting member is connected to a side of the first sliding block close to the first fixing member;

a second sliding member slidingly connecting the second abutting member and the second rotating member and comprising a second sliding rail disposed on the second rotating member and a second sliding block matched with the second sliding rail, wherein the second abutting member is connected to a side of the second sliding block close to the second fixing member.

14. The foldable display device according to claim 13, wherein the first rotating member further comprises a first limiting hole, the first limiting hole penetrates the first rotating member in a thickness direction of the first rotating member, the first sliding rail is provided on each of two opposite sides of the first limiting hole, the first sliding block comprises a first slider body and two first sliding rods connected to opposite sides of the first slider body, the two first sliding rods are respectively on the two first sliding rails, the first slider body is located in the first limiting hole, and a length of the first slider body is smaller than a length of the first limiting hole;

the second rotating member further comprises a second limiting hole, the second limiting hole penetrates the second rotating member in a thickness direction of the second rotating member, the second sliding rail is provided on each of two opposite sides of the second limiting hole, the second sliding block comprises a second slider body and two second sliding rods connected to opposite sides of the second slider body, the two second sliding rods are respectively on the two second sliding rails, the second slider body is located in the second limiting hole, and a length of the second slider body is smaller than a length of the first limiting hole.

15. The foldable display device according to claim 14, wherein a first T-shaped groove is provided on a surface of the first rotating member close to the fixed assembly, a depth of the first T-shaped groove is smaller than a thickness of the first rotating member, the first T-shaped groove comprises a first transverse groove and a first longitudinal groove, the first longitudinal groove is perpendicular to the first transverse groove, and the first limiting hole extends from the first longitudinal groove to the first transverse groove;

a second T-shaped groove is provided on a surface of the second rotating member close to the fixed assembly, a depth of the second T-shaped groove is smaller than a thickness of the second rotating member, the second T-shaped groove comprises a second transverse groove and a second longitudinal groove, the second longitudinal groove is perpendicular to the second transverse groove, and the second limiting hole extends from the second longitudinal groove to the second transverse groove.

16. The foldable display device according to claim 13, wherein the hinge assembly further comprises a synchronization assembly, and the synchronization assembly comprises:

a first gear connected to the first sliding block and the first abutting member, wherein the first abutting member is located on a side of the first gear that is close to the first fixing member, and the first gear is rotatably connected to the first fixing member; and a second gear connected to the second sliding block and the second abutting member, wherein the second abutting member is located on a side of the second gear that is close to the second fixing member, and the second gear is rotatably connected to the second fixing member.

17. The foldable display device according to claim 16, wherein the synchronization assembly further comprises:

a first synchronization wheel meshed with the first gear and rotatably connected to the first fixing member and the second fixing member;

a second synchronization wheel meshed with the first synchronization wheel and the second gear and rotatably connected to the first fixing member and the second fixing member.

18. The foldable display device according to claim 17, wherein the first fixing member comprises a third accommodating notch close to the second fixing member, the third accommodating notch has a first side wall facing the second fixing member, the second fixing member comprises a fourth accommodating notch close to the first fixing member, and the fourth accommodating notch has a second side wall facing the first fixing member;

each of the first side wall and the second side wall comprises a first mounting hole, a second mounting hole, a third mounting hole, and a fourth mounting hole arranged in sequence, the first mounting hole is disposed close to the first rotating member, and the fourth mounting hole is disposed close to the second rotating member;

wherein the first gear, the second gear, the first synchronization wheel, and the second synchronization wheel are disposed in a space enclosed by the third accommodating notch and the fourth accommodating notch, a rotating shaft of the first gear is inserted into the first mounting hole of the second side wall, a rotating shaft of the second gear is inserted into the fourth mounting hole of the first side wall, the two rotating shafts of the first synchronization wheel are respectively inserted into the second mounting hole of the first side wall and the second mounting hole of the second side wall, the two rotating shafts of the second synchronization wheel are respectively inserted into the third mounting hole of the first side wall and the third mounting hole of the second side wall.

19. The foldable display device according to claim 1, wherein the first support and the second support are both provided with a magnetic member;
   when the foldable display device is in a fully folded state, the magnetic members on the first support and the second support attract each other, the first elastic assembly is separated from the first abutting member, and the second elastic assembly is separated from the second abutting member.

\* \* \* \* \*